United States Patent
Lahoda

(10) Patent No.: US 12,421,593 B2
(45) Date of Patent: Sep. 23, 2025

(54) FIBER REINFORCED MULTI-LAYERED WEAR AND CORROSION COATINGS OF ZIRCONIUM ALLOY NUCLEAR FUEL CLADDING

(71) Applicant: Westinghouse Electric Company LLC, Cranberry Township, PA (US)

(72) Inventor: Edward J. Lahoda, Edgewood, PA (US)

(73) Assignee: Westinghouse Electric Company LLC, Cranberry Township, PA (US)

(*) Notice: Subject to any disclaimer, the term of this patent is extended or adjusted under 35 U.S.C. 154(b) by 292 days.

(21) Appl. No.: 17/934,733

(22) Filed: Sep. 23, 2022

(65) Prior Publication Data

US 2024/0102148 A1   Mar. 28, 2024

(51) Int. Cl.
C23C 14/14    (2006.01)
C23C 14/02    (2006.01)

(52) U.S. Cl.
CPC .......... *C23C 14/14* (2013.01); *C23C 14/024* (2013.01)

(58) Field of Classification Search
None
See application file for complete search history.

(56) References Cited

U.S. PATENT DOCUMENTS 3,108,516 A * 10/1963 Elam .................. B31C 3/00 493/301
5,391,428 A * 2/1995 Zender .................. C04B 35/80 442/178
9,982,350 B2   5/2018 Burke et al.
2012/0087457 A1   4/2012 Garnier et al.
2020/0020455 A1 * 1/2020 Lahoda ................. C23C 24/085
2022/0375631 A1   11/2022 Norlen et al.

FOREIGN PATENT DOCUMENTS

| RU | 2019118532 A | * 12/2020 | ............ B82Y 30/00 |
| RU | 2740701 C2 | 1/2021 | |
| TW | 202117749 B | 12/2021 | |
| WO | WO-2021112938 A2 | * 6/2021 | ........... C23C 14/025 |

OTHER PUBLICATIONS

Yakushkin—RU 2740701 C2—PCT D1—MT—fuel rod cladding—2021 (Year: 2021).*
Mikes Inventions—How to wrap spiral tubes—created 2015—captured Nov. 19, 2024 (Year: 2015).*
International Search Report and Written Opinion for corresponding International Application No. PCT/US2023/074435 dated Mar. 4, 2024.
Search Report for corresponding Taiwan Application No. 112136239 dated Jun. 5, 2024.

* cited by examiner

Primary Examiner — John Vincent Lawler
(74) Attorney, Agent, or Firm — K&L Gates LLP

(57) ABSTRACT

A covering for reinforcing a base layer of a nuclear fuel cladding is provided. The covering comprises a first layer configured to cover a first portion of the outer surface of the base layer of the nuclear fuel cladding, a second layer surrounding the first layer and the base layer and a third layer surrounding the second layer. The first layer comprises a fiber based material, the second layer comprises an interfacing material and the third layer comprises Chromium. A reinforced cladding for nuclear fuel and a method for producing a reinforced nuclear fuel cladding are also provided.

22 Claims, 2 Drawing Sheets

FIBER REINFORCED MULTI-LAYERED WEAR AND CORROSION COATINGS OF ZIRCONIUM ALLOY NUCLEAR FUEL CLADDING

GOVERNMENT SUPPORT

This invention was made with government support under Government Contract No. DE-NE00009033 awarded by the Department of Energy. The government has certain rights in the invention.

BACKGROUND

Chromium based coatings are currently employed in Zirconium alloy based claddings for accident tolerant fuel applications. The conventional coatings are inexpensive to apply and can effectively slow oxidation of the cladding at Beyond Design Basis Accident temperatures. However, the formation of intermetallic Zirconium-Chromium compounds at higher temperatures results in increased oxidation rates and eventually bursting of the cladding. Alternative cladding materials providing increased resistance to oxidation and/or bursting are more expensive than conventional materials and/or require complex manufacturing techniques. Therefore, a need exists to develop alternative claddings and manufacturing methods thereof to optimize the reliability and cost of accident tolerant fuel without compromising cladding integrity at high temperatures.

SUMMARY

The following summary is provided to facilitate an understanding of some of the innovative features unique to the aspects disclosed herein and is not intended to be a full description. A full appreciation of the various aspects disclosed herein can be gained by taking the entire specification, claims, and abstract as a whole.

In various aspects, a covering for reinforcing a base layer of a nuclear fuel cladding is disclosed. In some aspects, the covering includes a first layer configured to cover a first portion of the outer surface of the base layer of the nuclear fuel cladding, a second layer surrounding the first layer and the base layer of the nuclear fuel cladding and a third layer surrounding the second layer. In some aspects, the first layer comprises a fiber-based material, the second layer comprises an interfacing material configured to suppress a chemical interaction between the base layer and the third layer, and the third layer comprises Chromium. In some aspects, the second layer is configured to fasten the first layer to the base layer of the nuclear fuel cladding.

In various aspects, a reinforced cladding for nuclear fuel is disclosed. In some aspects, the reinforced cladding includes a tube comprising Zirconium alloy and a covering for the tube. In some aspects, the outer surface of the tube includes a first portion and a second portion. In some aspects, the covering includes a first layer comprising a fiber-based material; a second layer comprising a material with a melting point greater than a beyond design basis accident temperature; and a third layer comprising Chromium. In some aspects, the first layer covers the first portion of the outer surface of the tube, wherein the second portion of the outer surface of the tube comprises a surface remaining uncovered by the first layer; the second layer surrounds the first layer and the second portion of the outer surface of the tube; and the third layer surround the second layer.

In various aspects, a method for producing a reinforced nuclear fuel cladding is disclosed. In some aspects, the method includes helically wrapping a length of a fiber tape around an outer surface of a tubular base layer from a first end of the base layer to a second end of the base layer to form a first layer, wherein a portion of the helically wrapped outer surface of the base layer is exposed; depositing an interfacing material onto the fiber tape and the exposed portion of the outer surface of the base layer to form a second layer; and forming at least one Chromium-based layer around the second layer to produce the reinforced fuel cladding.

These and other objects, features, and characteristics of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of any of the aspects disclosed herein.

BRIEF DESCRIPTION OF THE DRAWINGS

The various aspects described herein, together with objects and advantages thereof, may best be understood by reference to the following description, taken in conjunction with the accompanying drawings as follows.

Figure 1:
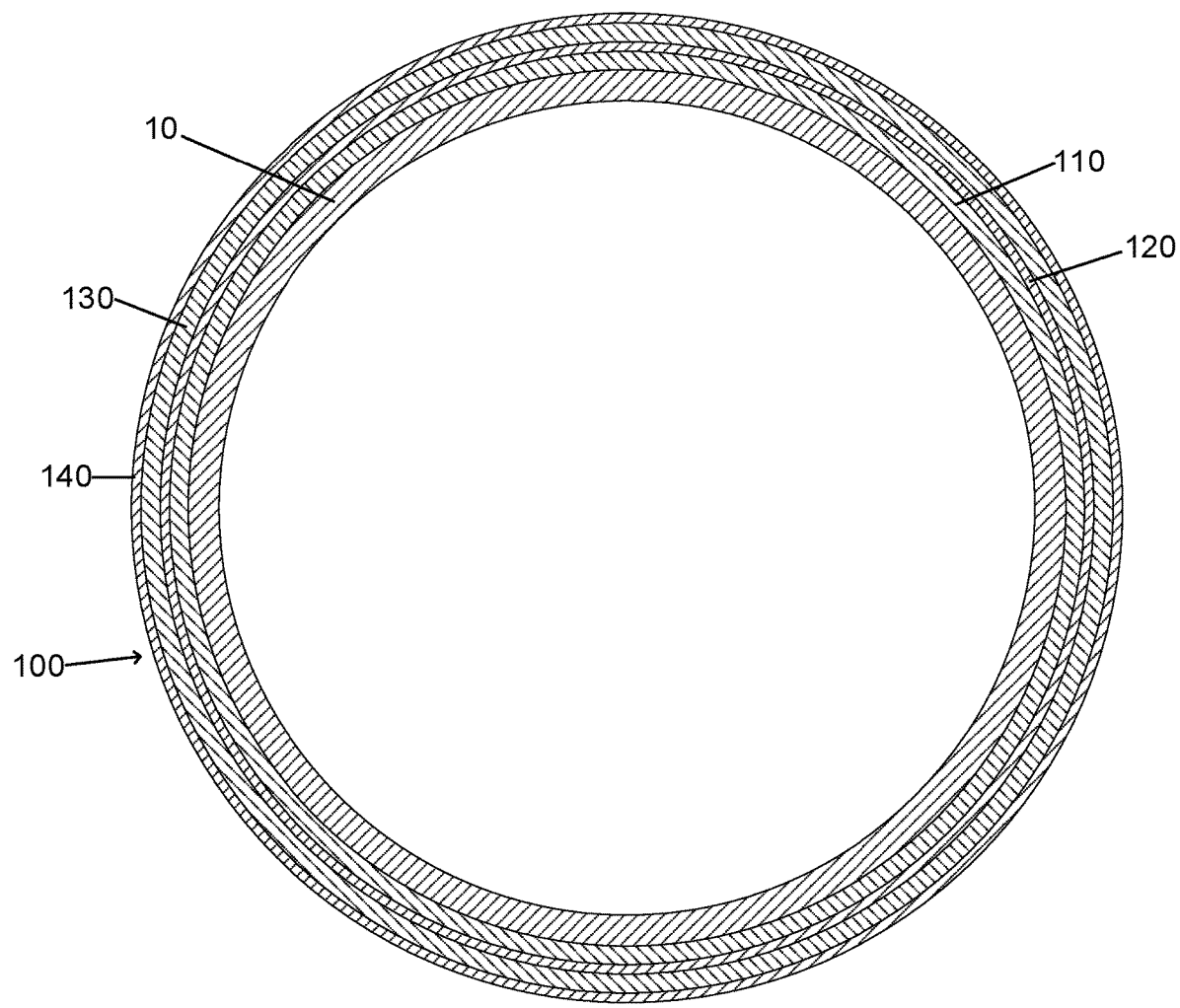
FIG. 1 is a cross-sectional schematic representation of a covering for a cladding base layer, in accordance with at least one non-limiting aspect of the present disclosure.

Corresponding reference characters indicate corresponding parts throughout the several views. The exemplifications set out herein illustrate various aspects of the present disclosure, in one form, and such exemplifications are not to be construed as limiting the scope of any of the aspects disclosed herein.

DETAILED DESCRIPTION

Certain exemplary aspects of the present disclosure will now be described to provide an overall understanding of the principles of the composition, function, manufacture, and use of the compositions and methods disclosed herein. An example or examples of these aspects are illustrated in the accompanying drawing. Those of ordinary skill in the art will understand that the compositions, articles, and methods specifically described herein and illustrated in the accompanying drawing are non-limiting exemplary aspects and that the scope of the various examples of the present disclosure is defined solely by the claims. The features illustrated or described in connection with one exemplary aspect may be combined with the features of other aspects. Such modifications and variations are intended to be included within the scope of the present disclosure.

Reference throughout the specification to "various examples," "some examples," "one example," "an example," or the like, means that a particular feature, structure, or characteristic described in connection with the example is included in an example. Thus, appearances of the phrases "in various examples," "in some examples," "in one example," "in an example," or the like, in places throughout the specification are not necessarily all referring to the same example. Furthermore, the particular features, structures, or characteristics may be combined in any suitable manner in an example or examples. Thus, the particular features, structures, or characteristics illustrated or described in connection with one example may be combined, in whole or in part, with the features, structures, or characteristics of another example or other examples without limitation. Such modifications and variations are intended to be included within the scope of the present examples.

In the following description, like reference characters designate like or corresponding parts throughout the several views of the drawings. Also in the following description, it is to be understood that such terms as "forward," "rearward," "left," "right," "above," "below," "upwardly," "downwardly," and the like are words of convenience and are not to be construed as limiting terms.

In the context of a nuclear reactor, the nuclear fuel of a fuel rod is contained in a sealed, thin wall tubular fuel cladding to transfer heat from fuel into the surrounding coolant in a predictable manner. For example, Zirconium (hereinafter referred to as "Zr") alloy claddings are typically employed in nuclear fuel rods for water reactors. Under normal reactor operating conditions, a Zr alloy cladding can be exposed to coolant without compromising cladding properties such as, for example, structural integrity and/or overall heat transfer characteristics. Since a Zr alloy's corrosion resistance to a given coolant chemistry can vary with operating temperature, the surface properties of a Zr alloy can determine the suitability thereof for a given reactor environment and/or operating temperature.

Accident Tolerant Fuel (hereinafter referred to as "ATF") has been developed in an effort to enhance the protection of nuclear fuel under unexpectedly high operating temperatures and/or accident conditions. For example, Chromium (hereinafter referred to as "Cr") coatings are compatible with pressurized water reactor (hereinafter referred to as "PWR") and CANDU type reactor chemistries and accident environments and are fairly inexpensive to apply onto Zr alloys. Thus, Cr coatings can be deposited onto a Zr alloy cladding to provide a relatively inexpensive ATF for PWR and CANDU reactors. The deposition of the Cr coating can decrease the oxidation rate of the cladding surface at Beyond Design Basis Accident (hereinafter referred to as "BDBA") temperatures, such as, for example, temperatures greater than 1200° C.

In practice, the Cr—Zr based materials in currently available claddings can undergo undesirable phase transformations. For example, at temperatures above about 1000° C., intermetallic compounds including $ZrCr_2$ begin to form at the eutectic Cr—Zr interface. $ZrCr_2$ is brittle, oxidizes readily and begins to melt at about 1332° C. At temperatures above 1332° C., the eutectic Cr—Zr layer expands and increases the oxidation rate of the Cr layer as the Zr dissolves further in the Cr. Moreover, at temperatures above 800° C., the fuel rod can undergo ballooning and bursting which results in dispersion of fission products and fuel into the primary system which increases the chance for these materials to be transferred to the secondary loop and ultimately beyond the plant boundaries. Not only does a burst cladding obstruct the cooling path around itself, but also around adjacent claddings which increases the likelihood a cascade effect of overheated and bursting of adjacent tubes. Thus, the original protection provided by the Cr coating can be compromised when exposed to high temperatures such as, for example, temperatures as low as 800° C., or 1000° C., or 1332° C.

Furthermore, while Cr is very compatible with reactor environments of PWR and CANDU type reactors, Cr is not compatible with normal operation Boiling Water Reactor (hereinafter referred to as "BWR") chemistry which has high levels of Oxygen, such as, for example, about 1 to 10 ppm Oxygen in the form of $O_2$. Since about 25% of the world's reactors are BWRs, a large fraction of reactors cannot take advantage of the ATF properties of the Cr coated Zr alloy fuel.

With respect to mechanical properties of Cr coatings, Cr coatings applied with cold spray techniques onto a Zr-alloy base layer can provide a coating having a greater hardness than Cr coatings applied with other techniques, such as, for example, Physical Vapor Deposition (hereinafter referred to as "PVD") or thermal spray techniques, thereby providing additional protection against debris and grid abrasion failures. However, the inventor of the present disclosure has found that cold sprayed Cr coatings may not be hard enough to prevent all wear type failures of the Zr-alloy during normal operation of all types of water reactors.

Other ATF claddings based on ceramic composites have been considered, such as, for example, composite Silicon Carbide (hereinafter referred to as "SiC") claddings. Composite SiC claddings can provide resistance to ballooning and/or bursting and resistance to excessive oxidation at temperatures up to about 1800° C. Additionally, composite SiC claddings are extremely hard and very resistant to wear type failure. However, the process for producing these composite claddings is very complex and requires expensive materials which result in a very high cost per cladding.

Various methods and devices provided by the present disclosure optimize the technical and economic aspects of providing claddings for ATFs in nuclear reactors such as, for example, PWR, CANDU and/or BWR type reactors. In some implementations, the optimization can increase protection in accident conditions, such as, for example, temperatures up to about 1600° C., and/or reduce and/or eliminate ballooning and/or bursting of the claddings without requiring complicated manufacturing processes or expensive materials. Accordingly, various aspects of the present disclosure provide various methods and devices for maintaining the structural integrity of fuel rods in accident conditions without the material limitations and/or high cost of currently available ATF claddings.

Referring to FIG. 1, a cross-sectional schematic representation of a covering 100 for a base layer 10 of a nuclear fuel cladding is provided in accordance with at least one non-limiting aspect of the present disclosure. In various examples, the covering 100 is comprised of a first layer 110, a second layer 120 surrounding the first layer 110 and a third layer 130 surrounding the second layer 120. In some examples, the covering can optionally include a fourth layer 140 surrounding the third layer 130 as shown in FIG. 1.

Figure 2:
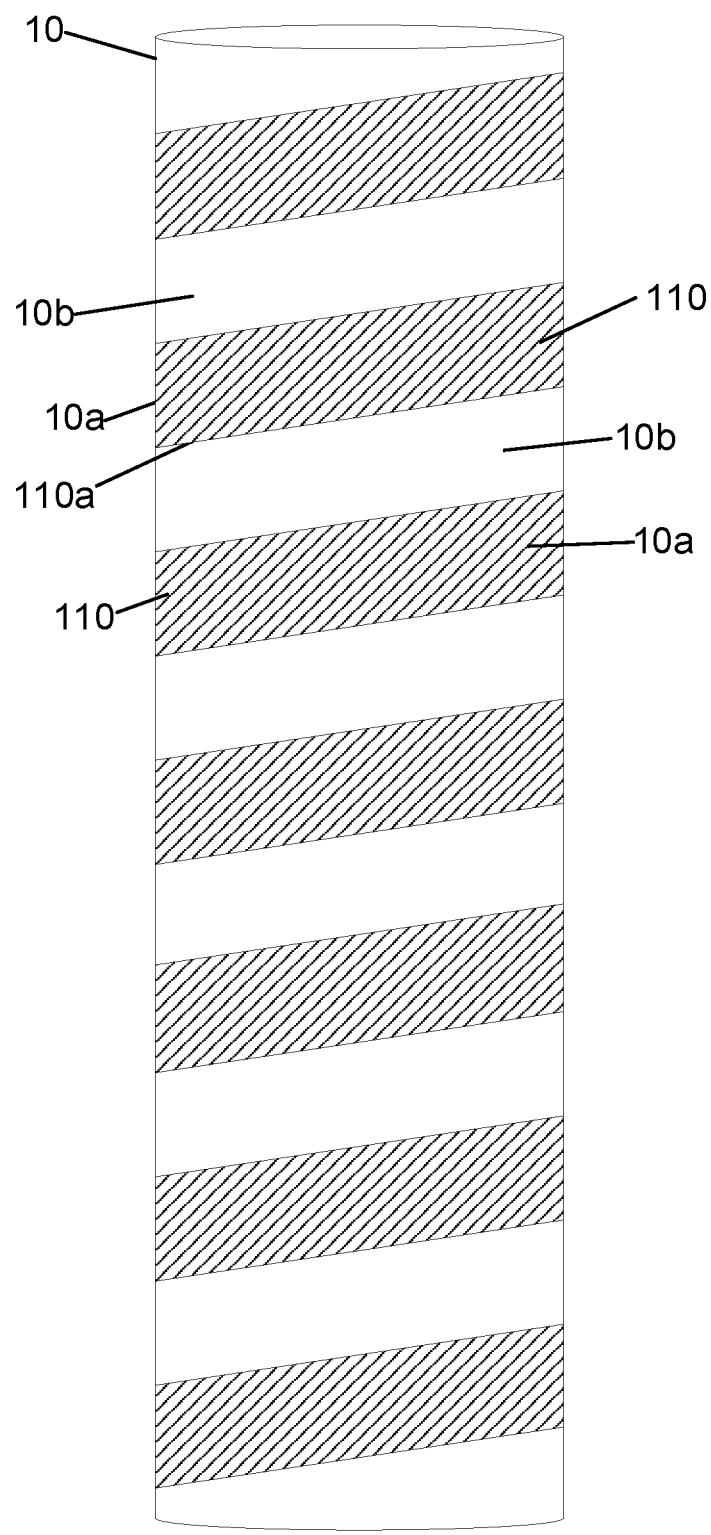
FIG. 2 is a schematic representation of a first layer and a base layer, in accordance with at least one non-limiting aspect of the present disclosure.

Now referring to FIG. 2, a perspective schematic representation of a first layer 110 disposed around a base layer 10 is provided in accordance with at least one non-limiting aspect of the present disclosure. The first layer 110 is comprised of a fiber-based material and is configured to partially cover the outer surface of the base layer 10. For example, the first layer 110 can include a SiC or a Carbon-fiber based material configured to cover a first portion 10a spanning the length of the outer surface of the base layer 10 about 40% to about 70% of the outer surface area of the base layer 10 while the remaining outer surface area of the base layer 10 comprises a second portion 10b of the base layer. In some examples, the first portion 10a and/or the first layer 110 is configured with a helical geometry spanning the length of the base layer 10. In certain examples, the geometry of the second portion 10b is configured to determine a spacing between neighboring sections of the first layer 110. For example, the second portion 10b can be interposed with and/or complement the geometry of the first layer 110 and/or the first portion 10a. The first layer 110 can have a thickness in the range of about 5 microns to 50 microns. Other configurations of the first layer 110 are contemplated by the present disclosure. For example, in some implementations, the geometry of the first layer 110 and/or first portion 10a can be configured as a mesh or any patterned network with a well-defined spacing.

Still referring to FIG. 2, the first layer 110 can be configured as a woven fiber tape. For example, the first layer 110 can be configured as a length of a SiC or a Carbon fiber tape wrapped around the length of the base layer 10 to cover a helical first portion 10a. In some examples, the width of the fiber tape can be in the range of about 1 millimeter to about 5 millimeters. In certain examples, the second portion 10b can be a helical portion having a width in the range of about 1 millimeter to about 5 millimeters interposed with a helically wrapped first layer 110. In examples where the first layer 110 is configured as a helically wrapped woven fiber tape, the width of the fiber tape and/or the spacing between adjacent edges 110a of neighboring turns of the helically wrapped first layer 110 defined by the width of the helically configured second portion 10b can be adjusted to provide a desired coverage of the base layer 10 with the first layer 110 as shown in FIG. 2. Other configurations of the woven fiber tape are contemplated by the present disclosure. For example, in some implementations, the woven fiber tape can be configured as a tape woven with multiple fiber compositions, such as, for example, SiC and Carbon fibers having comparable cross-sections.

Applying the helical configuration of the first layer 110 over the base layer 10 can impart the bursting and/or ballooning resistant properties of a SiC composite cladding without the high complexity or cost associated with a manufacture thereof. Surprisingly, it has been found by the present inventor that these features can be obtained with a coverage of between about 40% to about 70%, or between about 40% to about 60%, or about 50% of the outer surface of the base layer 10 with a first layer 110, thereby utilizing a lower quantity of expensive materials typically required by a SiC composite cladding. Additionally, a first layer 110 incorporating a Carbon-fiber tape can provide bursting and/or ballooning resistant advantages normally associated with SiC based materials at a comparatively lower cost.

Furthermore, in implementations incorporating a woven fiber tape, the thickness and spacing of the first layer 110 can be predetermined, thereby avoiding any complex procedures during an application thereof. Thus, a covering 100 incorporating this configuration of the first layer 110 can optimize technical and economic aspects of producing a cladding for ATFs without compromising protection from ballooning and/or bursting at high temperatures.

Now referring to FIGS. 1 and 2, in various examples, the second layer 120 is comprised of an interfacing material and is configured to fasten the first layer 110 to the base layer 10. For example, the second layer 120 can be a continuous layer of interfacing material covering the first layer 110 and the second portion 10b of the underlying base layer 10. In certain examples, the second layer 120 has a thickness of between about 1 and about 10 microns.

The second layer 120 can be configured as a continuous layer wherein the second layer 120 covers the first layer 110 and the second portion 10b of the underlying base layer 10 without any interruptions in the second layer 120. In examples where the second layer 120 is configured as a continuous layer on a helically wrapped first layer 110, the second layer 120 can be directly attached to both an exposed second portion 10b of the underlying base layer 10 and an outer portion of the first layer 110 to provide a continuous coupling thereof along an edge 110a of the first layer 110 forming a boundary with a second portion 10b. Thus, the number of first layer 110 to second portion 10b transitions and/or length of boundaries between the first layer 110 and the second portion 10b coupled to the second layer 120 can be configured to provide a desired fastening strength between the first layer 110 and the base layer 10. Accordingly, the second layer 120 can provide a fastening of the first layer 110 without requiring any specific bonding interaction between the first layer 110 and an underlying first portion 10a.

In examples of the covering 100 where the first layer 110 and the second portion 10b of the outer surface of the base layer 10 are configured as interposed helical geometries, a desired fastening strength of the first layer 110 to a base layer 10 having a given axial length can be obtained by adjusting the width of the first layer 110 and/or the spacing between each turn of the first layer 110 defined by the width of the second portion 10b. Furthermore, by maintaining a width proportion between the first layer 110 and the second portion 10b in the adjustment described herein, the fastening strength of the first layer 110 to a base layer 10 can be adjusted without substantially affecting the coverage provided by the first layer 110, thereby providing a reliable coverage of the base layer 10 and positioning of the first layer 110. Accordingly, a covering 100 can be configured to provide the benefit of a predictable resistance to ballooning and/or bursting.

In some examples, the interfacing material has a melting point greater than a BDBA temperature, or greater than 1200° C., or greater than 1400° C., or greater than 1600° C., or greater than 2000° C. Thus, any lower temperature functionality of the second layer 120 dependent on a physical state thereof will be maintained during accident conditions or otherwise high temperature operating conditions. In certain examples, the interfacing material can be comprised of Molybdenum, Niobium, Tantalum, or Tungsten.

Now referring to FIG. 1, the third layer 130 is configured to provide the enhanced protection of an ATF in BDBA, high temperature, and/or normal operating conditions. For example, the third layer 130 can be comprised of a metallic Cr-based material and can have a thickness between about 2 and about 50 microns. In various examples, the Cr-based material of the third layer 130 is a coating comprised of Chromium or a Cr-based alloy. In some examples, the third layer 130 can comprise a Chromium alloy including Yttrium, Molybdenum, Iron, Aluminum, or a combination thereof. These alloying elements can produce Chromium alloys having a higher tensile strength than Chromium alone. Thus, the composition of the third layer 130 can be configured to provide a coating having a higher tensile strength than a coating comprised of Chromium alone. In certain examples, the third layer 130 is configured as a Chromium alloy including Yttrium or Molybdenum or a Chromium alloy including Iron and/or Aluminum.

Although the third layer 130 can be comprised of a Cr-based material, the covering 100 can be configured to avoid a formation of a low melting eutectic layer or any undesirable characteristics thereof. For example, when a second layer 120 configured as a continuous layer comprised of Molybdenum, Niobium, Tantalum, or Tungsten is deposited over a Zr-based base layer 10, any migration of the Cr-content of the third layer 130 towards the second portion 10b of the Zr-based base layer 10 will be suppressed at high temperature conditions, such as, for example, a BDBA temperature. Thus, a covering 100 can be configured to avoid a formation of a low melting eutectic Cr—Zr layer and/or intermetallic Zr—Cr compounds at BDBA or high temperature conditions, thereby providing the corrosion resistant benefits of a Cr-based coating without the inherent limitations associated with claddings having a Cr—Zr interface.

In examples where the covering 100 includes the optional fourth layer 140, the fourth layer is configured as an outer layer comprised of a Cr-based material to further enhance the accident tolerance of cladding. For example, the optional fourth layer 140 can be configured as a Cr-based alloy or a Cr-based ceramic material. In some examples, the fourth layer 140 includes a Cr-alloy including Yttrium or Molybdenum or a Cr-alloy including Iron and/or Aluminum. In other examples, the fourth layer 140 is configured as a Cr-based ceramic material including Nitrogen and/or Niobium. These alloys and ceramics are known to tolerate coolant having an $O_2$ content, such as, for example, up to about 10 ppm $O_2$. Thus, a covering 100 including a fourth layer 140 can be configured to provide protection in a BWR application.

As discussed herein, the present disclosure provides a reinforced cladding for nuclear fuel. In various examples, the reinforced cladding includes a tube comprised of a Zr-alloy and a covering disposed on the outer surface of the tube. The outer surface of the tube includes a first portion and a second portion. In some examples, the first portion of the outer surface of the tube is configured as a helix having a number of turns. In the helical configuration of the first portion of the outer surface of the tube, each of the number of turns of the first portion can be axially separated by the second portion of the outer surface of the tube.

The covering of the reinforced cladding is similar in many respects to other coverings disclosed elsewhere in the present disclosure, which are not repeated herein at the same level of detail for brevity. Thus, the covering of the reinforced cladding can include a first layer configured to surround the first portion of the outer surface of the tube, a second layer surrounding the first layer and the second portion of the outer surface of the tube, a third layer surrounding the second layer and optionally, a fourth layer surrounding the third layer. In various examples, the first layer is comprised of a fiber-based material, the second layer is comprised of a material with a melting point greater than a BDBA temperature, and the third layer is comprised of a Cr-based material.

The layers of the covering can be configured similarly to the layers 110, 120, 130 and 140 of the covering 100 as described hereinabove. Thus, the first layer can be configured to provide protection from ballooning and/or bursting at high temperatures, the second layer can be configured to fasten the first layer to the Zr-alloy tube while also blocking the formation of intermetallic compounds between the Zr-alloy tube and the third Cr-based layer. Accordingly, the third layer can be configured to provide enhanced corrosion resistance in BDBA conditions without the drawbacks of a cladding incorporating a Zr—Cr interface. Additionally, in examples of the reinforced cladding including the optional fourth layer, the fourth layer can be configured to further enhance the accident tolerance of the cladding, such as, for example, in BWR coolant chemistries. A reinforced cladding incorporating this configuration can provide protection to nuclear fuel contained therein at temperatures up to about 1600° C., or about 1700° C., or about 1800° C., without the cost penalty or risk of excessive corrosion associated with currently available claddings.

As discussed herein, a method for producing the reinforced cladding for nuclear fuel described hereinabove is provided by the present disclosure. In various examples, the method includes helically wrapping a length of a fiber tape around an outer surface of a tubular base layer from a first end of the base layer to a second end of the base layer to form a first layer, depositing an interfacing material onto the first layer to form a second layer, and forming at least one Cr-based layer around the second layer to produce the reinforced fuel cladding. A portion of the helically wrapped outer surface of the base layer is left exposed following the formation of the first layer so that the interfacing material of the second layer is deposited onto both the fiber tape and the exposed portions of the base layer.

The fiber tape is similar in many respects to other fiber tapes disclosed elsewhere in the present disclosure, which are not repeated herein at the same level of detail for brevity. Thus, the fiber tape can be configured to include SiC and/or Carbon fiber. In some examples, the method includes holding the length of the fiber tape against the first end and the second end of the fuel cladding prior to forming the second layer. In certain examples, the fiber tape is wrapped around the length of the tubular base layer to cover about 40% to about 70% of the outer surface of the base layer. In one example, the fiber tape is wrapped around the length of the tubular base layer to cover about 50% of the outer surface of the base layer.

In some examples, the formation of the second layer can be configured to incorporate either a Physical Vapor Deposition (hereinafter referred to as "PVD") process or a thermal spray process. Incorporation of these processes can preserve the underlying fiber tape. For example, if the interfacing material is metallic such as, for example, Molybdenum, Niobium, Tantalum, or Tungsten, neither PVD or thermal spray processes for depositing the interfacing material with a PVD or a thermal spray process will not impart significant stresses on an underlying surface as these processes do not rely on a collision and/or deformation of a hard particle comprised of the interfacing material with the surface to deposit a layer of the interfacing material. Thus, the formation of the second layer can be configured to avoid abrasion of the underlying fiber tape. Accordingly, the method described herein can be configured to provide a reinforced cladding having a predictable resistance to bursting and/or ballooning.

In some examples of the method, each of the at least one Cr-based layers can be independently formed by a Physical Vapor Deposition process, a thermal spray process, or a cold spray process. In certain examples, the method can include forming a third layer around the second layer and forming an outer layer around the third layer. The third layer can be comprised of Chromium or a Cr-based alloy and the outer layer can be comprised of a Cr-based alloy or a Cr-based ceramic material.

Various aspects of the present disclosure include, but are not limited to, the aspects listed in the following numbered clauses.

Clause 1—A covering for reinforcing a base layer of a nuclear fuel cladding. The covering comprises a first layer comprising a fiber-based material, a second layer comprising an interfacing material and a third layer comprising Chromium. The first layer is configured to cover a first portion of the outer surface of the base layer of the nuclear fuel cladding without covering a second portion of the outer surface of the base layer, the second layer surrounds the first layer and the base layer of the nuclear fuel cladding, and the third layer surrounds the second layer. The second layer is configured to fasten the first layer to the base layer of the nuclear fuel cladding. The interfacing material of the second layer is configured to suppress a chemical interaction between the base layer and the third layer.

Clause 2—The covering of clause 1, wherein the first layer comprises at least one of Silicon Carbide or Carbon fiber.

Clause 3—The covering of any one of clauses 1-2, wherein the first layer covers from about 40% to about 70% of the area of the outer surface of the base layer of the nuclear fuel cladding.

Clause 4—The covering of any one of clauses 1-3, wherein the first portion of the base layer of the nuclear fuel cladding is a helical portion of the outer surface of the base layer.

Clause 5—The covering of any one of clauses 1-4, wherein the first layer is configured as a fiber tape.

Clause 6—The covering of clause 5, wherein the fiber tape has a width in the range of about 1 millimeter to about 5 millimeters.

Clause 7—The covering of any one of clauses 1-6, wherein the interfacing material has a melting point greater than a beyond design basis accident temperature.

Clause 8—The covering of clause 7, wherein the second layer comprises Molybdenum, Niobium, Tantalum, or Tungsten.

Clause 9—The covering of any one of clauses 1-8, wherein the third layer comprises a Chromium-based alloy.

Clause 10—The covering of clause 9, wherein the Chromium-based alloy comprises Yttrium or Molybdenum.

Clause 11—The covering of clause 9, wherein the Chromium-based alloy comprises Iron, Aluminum, or a combination thereof.

Clause 12—The covering of any one of clauses 1-8, wherein the third layer comprises a Chromium-based ceramic material comprising Nitrogen, Niobium, or a combination thereof.

Clause 13—The covering of any one of clauses 1-12, wherein the covering comprises a fourth layer configured to surround third layer. The fourth layer is comprised of a Chromium-based alloy or a Chromium-based ceramic material.

Clause 14—A reinforced cladding for nuclear fuel. The reinforced cladding comprises a tube and a covering for the tube. The tube is comprised of a Zirconium alloy and an outer surface of the tube comprises a first portion and a second portion. The covering for the tube comprises a first layer comprising a fiber-based material, a second layer comprising a material with a melting point greater than a beyond design basis accident temperature and a third layer comprising Chromium. The first layer covers the first portion of the outer surface of the tube and the second portion of the outer surface of the tube comprises a surface remains uncovered by the first layer. The second layer surrounds the first layer and the second portion of the outer surface of the tube. The third layer surrounds the second layer.

Clause 15—The reinforced cladding of clause 14, wherein the first layer comprises at least one of Silicon Carbide or Carbon fiber.

Clause 16—The reinforced cladding of any one of clauses 14-15, wherein the first layer covers from about 40% to about 70% of the outer surface of the tube.

Clause 17—The reinforced cladding of any one of clauses 14-16, wherein the first layer is configured as a helix having a number of turns.

Clause 18—The reinforced cladding of clause 17, wherein each of the number of turns is axially separated by the second portion of the outer surface of the tube.

Clause 19—A method for producing a reinforced nuclear fuel cladding. The method comprises helically wrapping a length of a fiber tape around an outer surface of a tubular base layer from a first end of the base layer to a second end of the base layer to form a first layer, wherein a portion of the helically wrapped outer surface of the base layer is exposed. The method further comprises depositing an interfacing material onto the fiber tape and the exposed portion of the outer surface of the base layer to form a second layer and forming at least one Chromium-based layer around the second layer to produce the reinforced fuel cladding.

Clause 20—The method of clause 19, wherein the second layer is formed by a Physical Vapor Deposition process or a thermal spray process.

Clause 21—The method of any one of clauses 19-20, wherein each of the at least one Chromium-based layers is independently formed by a Physical Vapor Deposition process, a thermal spray process, or a cold spray process.

Clause 22—The method of any one of clauses 19-22, wherein the forming at least one Chromium-based layer comprises forming a third layer around the second layer and forming an outer layer around the third layer. The third layer comprises Chromium or a Chromium-based alloy. The outer layer comprises a Chromium-based alloy or a Chromium-based ceramic.

Various features and characteristics are described in this specification to provide an understanding of the composition, structure, production, function, and/or operation of the disclosure, which includes the disclosed methods and systems. It is understood that the various features and characteristics of the disclosure described in this specification can be combined in any suitable manner, regardless of whether such features and characteristics are expressly described in combination in this specification. The Inventors and the Applicant expressly intend such combinations of features and characteristics to be included within the scope of the disclosure described in this specification. As such, the claims can be amended to recite, in any combination, any features and characteristics expressly or inherently described in, or otherwise expressly or inherently supported by, this specification. Furthermore, the Applicant reserves the right to amend the claims to affirmatively disclaim features and characteristics that may be present in the prior art, even if those features and characteristics are not expressly described in this specification. Therefore, any such amendments will not add new matter to the specification or claims and will comply with the written description, sufficiency of description, and added matter requirements.

With respect to the appended claims, those skilled in the art will appreciate that recited operations therein may generally be performed in any order. Also, although various operational flows are presented in a sequence(s), it should be understood that the various operations may be performed in other orders than those that are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

The invention(s) described in this specification can comprise, consist of, or consist essentially of the various features and characteristics described in this specification. The terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. Thus, a method or system that "comprises," "has," "includes," or "contains" a feature or features and/or characteristics possesses the feature or those features and/or characteristics but is not limited to possessing only the feature or those features and/or characteristics. Likewise, an element of a composition, coating, or process that "comprises," "has," "includes," or "contains" the feature or features and/or characteristics possesses the feature or those features and/or characteristics but is not limited to possessing only the feature or those features and/or characteristics and may possess additional features and/or characteristics.

The grammatical articles "a," "an," and "the," as used in this specification, including the claims, are intended to include "at least one" or "one or more" unless otherwise indicated. Thus, the articles are used in this specification to refer to one or more than one (i.e., to "at least one") of the grammatical objects of the article. By way of example, "a component" means one or more components and, thus, possibly more than one component is contemplated and can be employed or used in an implementation of the described compositions, coatings, and processes. Nevertheless, it is understood that use of the terms "at least one" or "one or more" in some instances, but not others, will not result in any interpretation where failure to use the terms limits objects of the grammatical articles "a," "an," and "the" to just one. Further, the use of a singular noun includes the plural, and the use of a plural noun includes the singular, unless the context of the usage requires otherwise.

In this specification, unless otherwise indicated, all numerical parameters are to be understood as being prefaced and modified in all instances by the term "about," in which the numerical parameters possess the inherent variability characteristic of the underlying measurement techniques used to determine the numerical value of the parameter. At the very least, and not as an attempt to limit the application of the doctrine of equivalents to the scope of the claims, each numerical parameter described herein should at least be construed in light of the number of reported significant digits and by applying ordinary rounding techniques.

Any numerical range recited herein includes all sub-ranges subsumed within the recited range. For example, a range of "1 to 10" includes all sub-ranges between (and including) the recited minimum value of 1 and the recited maximum value of 10, that is, having a minimum value equal to or greater than 1 and a maximum value equal to or less than 10. Also, all ranges recited herein are inclusive of the end points of the recited ranges. For example, a range of "1 to 10" includes the end points 1 and 10. Any maximum numerical limitation recited in this specification is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited. All such ranges are inherently described in this specification.

As used in this specification, particularly in connection with layers, the terms "on," "onto," "over," and variants thereof (e.g., "applied over," "formed over," "deposited over," "provided over," "located over," and the like) mean applied, formed, deposited, provided, or otherwise located over a surface of a substrate but not necessarily in contact with the surface of the substrate. For example, a layer "applied over" a substrate does not preclude the presence of another layer or other layers of the same or different composition located between the applied layer and the substrate. Likewise, a second layer "applied over" a first layer does not preclude the presence of another layer or other layers of the same or different composition located between the applied second layer and the applied first layer.

Whereas particular examples of this disclosure have been described above for purposes of illustration, it will be evident to those skilled in the art that numerous variations of the details of the present disclosure may be made without departing from the disclosure as defined in the appended claims.

What is claimed is:

1. A covering for reinforcing a base layer of a nuclear fuel cladding, the covering comprising:
    a first layer disposed directly atop a first portion of an outer surface of the base layer of the nuclear fuel cladding, the first layer comprising a fiber-based material, wherein a second portion of the outer surface of the base layer remains uncovered by the first layer;
    a second layer disposed atop the first layer and in direct contact with the second portion of the base layer of the nuclear fuel cladding, the second layer comprising an interfacing material, wherein the second layer is configured to fasten the first layer to the base layer of the nuclear fuel cladding;
    a third layer disposed atop the second layer, the third layer comprising Chromium; and
    wherein the interfacing material of the second layer is configured to suppress a chemical interaction between the base layer and the third layer.

2. The covering as claimed in claim 1, wherein the first layer comprises at least one of Silicon Carbide or Carbon fiber.

3. The covering as claimed in claim 1, wherein the first layer covers from about 40% to about 70% of the area of the outer surface of the base layer of the nuclear fuel cladding.

4. The covering as claimed in claim 1, wherein the first portion of the base layer of the nuclear fuel cladding is a helical portion of the outer surface of the base layer.

5. The covering as claimed in claim 1, wherein the first layer is configured as a fiber tape.

6. The covering as claimed in claim 5, wherein the fiber tape has a width in the range of about 1 millimeter to about 5 millimeters.

7. The covering as claimed in claim 1, wherein the interfacing material has a melting point greater than a beyond design basis accident temperature.

8. The covering as claimed in claim 7, wherein the second layer comprises Molybdenum, Niobium, Tantalum, or Tungsten.

9. The covering as claimed in claim 1, wherein the third layer comprises a Chromium-based alloy.

10. The covering as claimed in claim 9, wherein the Chromium-based alloy comprises Yttrium or Molybdenum.

11. The covering as claimed in claim 9, wherein the Chromium-based alloy comprises Iron, Aluminum, or a combination thereof.

12. The covering as claimed in claim 1, wherein the third layer comprises a Chromium-based ceramic material comprising Nitrogen, Niobium, or a combination thereof.

13. The covering as claimed in claim 1, wherein the covering comprises a fourth layer configured to surround the third layer, wherein the fourth layer is comprised of a Chromium-based alloy or a Chromium-based ceramic material.

14. A covering for reinforcing a cladding tube of a nuclear reactor, the covering comprising:
   a first layer helically disposed atop the cladding tube, the first layer comprising a fiber-based material, wherein the first layer directly covers a first helical portion of an outer surface of the cladding tube and wherein a second helical portion of the outer surface of the cladding tube remains uncovered by the first layer;
   a second layer disposed atop the first layer and in direct contact with the second portion of the cladding tube, the second layer comprising an interfacing material, wherein the second layer is directly attached to the second helical portion of the cladding tube and to the first layer to fasten the first layer to the cladding tube; and
   a third layer disposed atop the second layer, the third layer comprising Chromium, wherein the interfacing material of the second layer is configured to suppress a chemical interaction between the cladding tube and the third layer.

15. The covering as claimed in claim 14, wherein the second layer covers the first layer and the second helical portion of the cladding tube without any interruptions in the second layer.

16. The covering as claimed in claim 14, wherein the first layer comprises at least one of Silicon Carbide or Carbon fiber.

17. The covering as claimed in claim 14, wherein the first layer directly covers from about 40% to about 70% of the area of the outer surface of the cladding tube of the nuclear fuel rod.

18. The covering as claimed in claim 14, wherein the first layer is configured as a fiber tape.

19. The covering as claimed in claim 14, wherein the interfacing material has a melting point greater than a beyond design basis accident temperature.

20. The covering as claimed in claim 14, wherein the second layer comprises Molybdenum, Niobium, Tantalum, or Tungsten.

21. The covering as claimed in claim 14, wherein the third layer comprises a Chromium-based alloy.

22. The covering as claimed in claim 14, wherein the covering comprises a fourth layer configured to surround the third layer, wherein the fourth layer is comprised of a Chromium-based alloy or a Chromium-based ceramic material.

* * * * *